United States Patent
Chen et al.

[19]

[11] Patent Number: 5,970,379
[45] Date of Patent: Oct. 19, 1999

[54] METHOD OF REDUCING LOSS OF METAL SILICIDE IN PRE-METAL ETCHING

[75] Inventors: Tung-Po Chen, Taichung; Hong-Tsz Pan, Hsinchu Hsien, both of Taiwan

[73] Assignee: United Microelectronics Corporation, Taiwan

[21] Appl. No.: 08/678,824

[22] Filed: Jul. 12, 1996

[30] Foreign Application Priority Data

Apr. 15, 1996 [TW] Taiwan ................................. 85104465

[51] Int. Cl.$^6$ .................................................. H01L 21/44
[52] U.S. Cl. ........................ 438/682; 438/649; 438/651; 438/655; 438/721
[58] Field of Search ............................ 437/200; 438/302, 438/305, 592, 627, 634, 643, 648, 720, 724, 682, 649, 651, 655, 721

[56] References Cited

U.S. PATENT DOCUMENTS

| | | | |
|---|---|---|---|
| 5,130,266 | 7/1992 | Huang et al. | 437/44 |
| 5,451,529 | 9/1995 | Hsu et al. | 437/8 |
| 5,576,228 | 11/1996 | Chen et al. | 437/35 |
| 5,593,923 | 1/1997 | Horiuchi et al. | 437/200 |
| 5,605,854 | 2/1997 | Yoo | 437/44 |
| 5,750,438 | 5/1998 | Hsue et al. | 438/627 |

*Primary Examiner*—Chandra Chaudhari
*Assistant Examiner*—Reneé R. Berry
*Attorney, Agent, or Firm*—Oppenheimer Wolff & Donnelly LLP

[57] ABSTRACT

A method of reducing the loss of metal silicide in pre-metal etching which includes the following steps. A polysilicon gate electrode and implanted source/drain electrodes are formed on a silicon substrate. A metal silicide layer is formed on the polysilicon gate electrode and the source/drain electrodes. On the surface of the substrate, the polysilicon gate electrode, the source-drain electrodes region and the metal silicide layer, a protecting glass for insulation is formed and then dry etched to form a contact window. The metal silicide layer will form a damaged metal silicide layer in the contact window. Thereafter, a thermal process is conducted to repair the damaged metal silicide layer and finally, pre-metal etching is conducted completing the process. Pursuant to this method, the extremely low resistance of the metal silicide remains.

17 Claims, 4 Drawing Sheets

METHOD OF REDUCING LOSS OF METAL SILICIDE IN PRE-METAL ETCHING

BACKGROUND OF THE INVENTION

1. Field of the Invention

This invention relates in general to a method of reducing the loss of silicide and more particularly to a method of reducing the loss of metal silicide in pre-metal etching by adding a thermal process before pre-metal etching.

2. Description of Related Art

As the integrity of integrated circuit devices increases, e.g. the density of the integrated circuit increases, the characteristics of the devices such as its operating speed can be seriously effected. This is because the resistances of the source and drain electrodes of metal oxide semiconductor (MOS) transistors of the devices are gradually increased to be equal to the channel resistance of the MOS transistors. Therefore, the sheet resistance of the source and drain electrodes must be reduced by forming a low resistance metal silicide on the surface of the source and drain electrodes or on the surface of the polysilicon of the gate, and to ensure the completeness of the shallow junction between the metal and the MOS transistors.

When the low resistance metal silicide is formed, the MOS transistors are completed. After that, a glass layer is formed for protection and isolation. Since the glass transition temperature of the glass layer is low, the glass layer can be planarized by heating to cause the glass layer to flow. After forming contact windows by photolithography and etching processes, the glass layer can be reflowed by heating, for better deposition of metal sputtering in the defined contact windows. Before metal sputtering, a pre-metal etching is used to remove native oxide on the surface of the metal silicide.

Since pre-metal etching will also etch the metal silicide, the metal silicide layer becomes too thin. This results in a significant increase of the sheet resistance of the source/drain electrodes and the junction leakage.

FIG. 1 is a flow chart illustrating the conventional processes before metal sputtering. After forming the protecting glass layer, the contact windows for the ohmic contact between the metal layer and metal silicide must be defined, which is done by dry etching step 10. The photo and photoresist stripping steps are not shown in the figure. Since the metal silicide will react with oxygen in the ambient atmosphere to form native oxide layer, a pre-metal etching step 12 is conducted to remove the native oxide layer before metal sputtering.

FIGS. 2A and 2B are schematic diagrams illustrating the conventional process before metal sputtering and the conventional process after metal sputtering. In FIG. 2A, before pre-metal etching step, the main structure of the MOS transistor is completed, which includes a silicon substrate 20, and a polysilicon gate 22 and doped source/drain electrodes regions 24 formed on the silicon substrate. A metal silicide layer 26 made of $TiSi_2$ is formed on the polysilicon gate 22 and doped source/drain electrodes regions 24. A glass protecting layer 28 is deposited thereon. After dry etching, contact windows are defined, but the metal silicide layer will be damaged and a damaged metal silicide layer 25 thereby formed.

Referring to FIG. 2B, after pre-metal etching, the damaged metal silicide layer 25 is easily removed. Thus, the metal silicide layer 29 left in the contact window will become shallow. As a result, the resistance of the metal silicide layer 29 will be seriously increased, and the junction leakage and sheet resistance of the source/drain electrodes will also increase. Table I below shows the resistance change of the metal silicide.

TABLE I

| original resistance | resistance after dry etching | duration of pre-metal etching | resistance after pre-metal etching |
|---|---|---|---|
| 3.3 Ω | 4.77 Ω | 20 sec | 25.4 Ω |
| 3.3 Ω | 4.77 Ω | 40 sec | 225.2 Ω |

SUMMARY OF THE INVENTION

It is therefore an object of the present invention to provide a method of reducing the loss of silicide in pre-metal etching to maintain the low sheet resistance of source-drain electrodes and low junction leakage to keep the characteristics of the transistor from being influenced.

The present invention achieves the above-identified objects by providing a method of reducing the loss of silicide in pre-metal etching. It contains the following steps. A polysilicon gate electrode and implanted source/drain electrodes are formed on a silicon substrate. A silicide layer is formed on the polysilicon gate electrode and the source/drain electrodes. On the surface of the substrate, the polysilicon gate electrode, the source-drain electrodes region and the silicide layer, protecting insulation glass is formed and then dry etched to form a contact window. The mentioned silicide layer will form a damaged silicide layer in the contact window. Thereafter, a thermal process is conducted to repair the damaged silicide layer and finally, the pre-metal etching is conducted completing the process. According to the above steps, the extremely low resistance of the silicide remains.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 1:
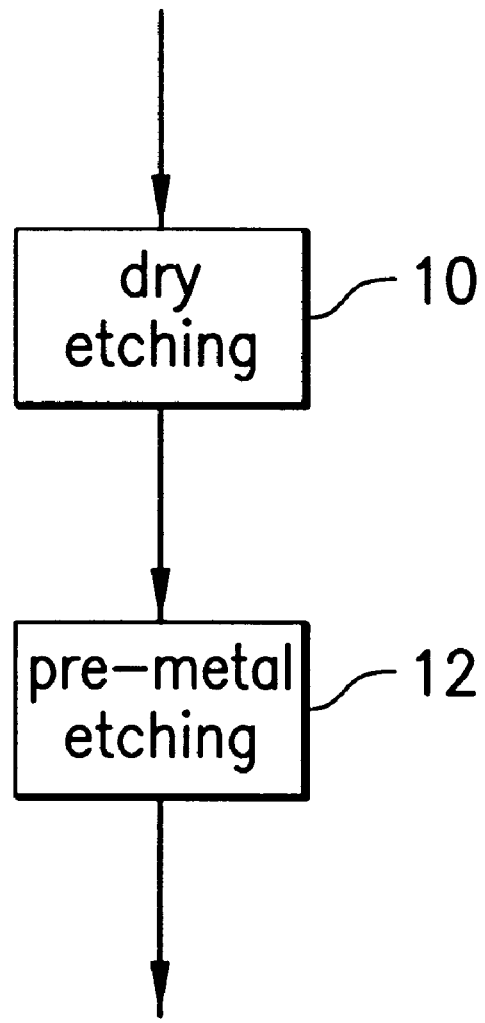
FIG. 1 is a flow chart illustrating the conventional process before metal sputtering.
Figure 2A:
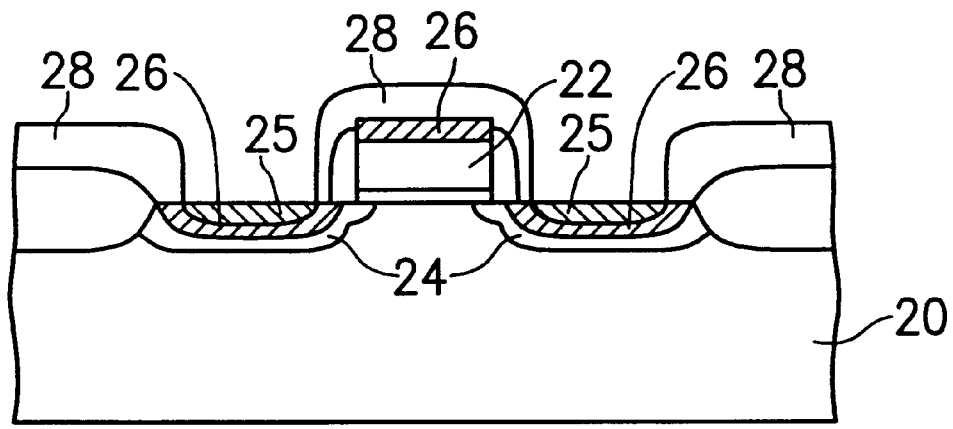
FIGS. 2A and 2B are schematic cross-sectional diagrams illustrating the conventional process before pre-metal etching and the conventional process after pre-metal etching.
Figure 2B:
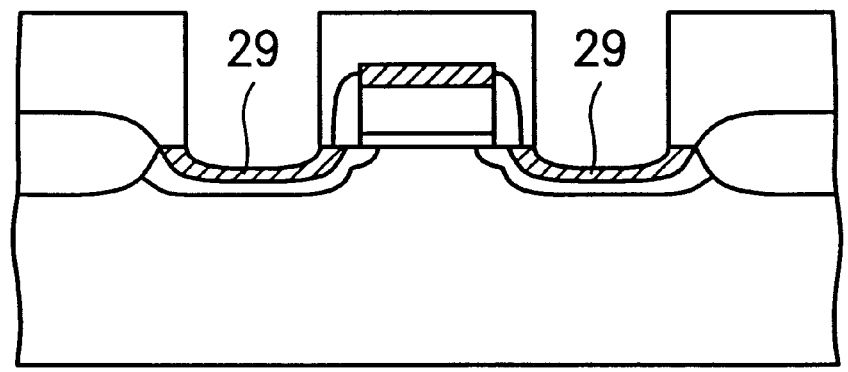
Figure 3:
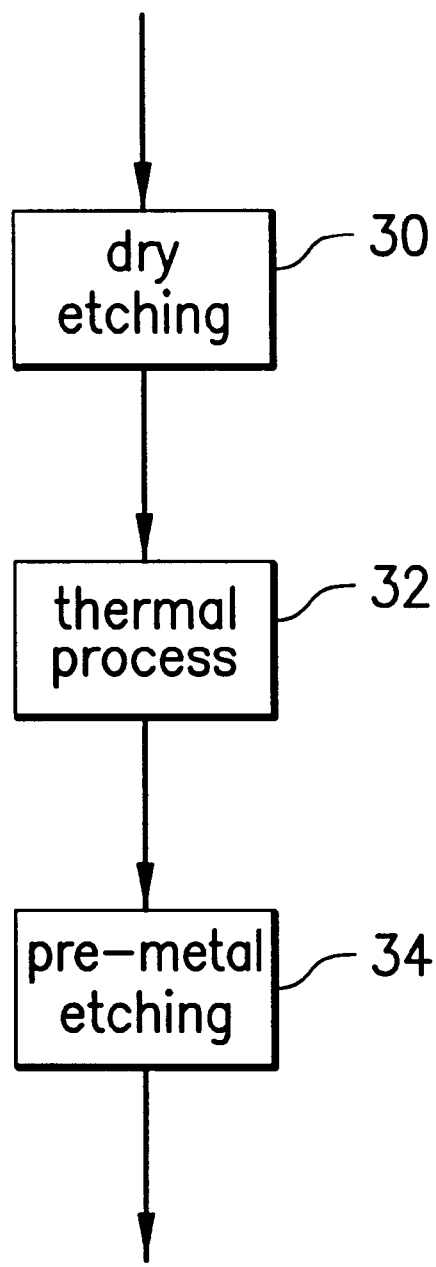
FIG. 3 is a flow chart illustrating the process before metal sputtering according to the present invention.

The principle method of the present invention is to add a thermal process before pre-metal etching. FIG. 3 is a schematic flow chart illustrating the process before metal sputtering according to the present invention. The protecting glass layer for insulation is formed and then etched to define a contact window. Generally, the protecting glass layer could be a borophosphosilicate glass layer or a phosphosilicate glass layer. In fact, it is a silicon dioxide layer doped with impurities so that the etching of the glass layer is completed by dry etching step 30 using gases containing fluorocarbon and Ar.

In dry etching step 30 to define the contact window, since ion bombardment from plasma will encompass the damage of the metal silicide under the contact window, the damaged metal silicide must be repaired by thermal annealing process step 32. The thermal process step 32 is done by putting the wafer after dry etching into a furnace to be heated at a temperature from 550° C. to 850° C. for five to thirty minutes, or by rapid thermal processing with the same temperature range of from 550° C. to 850° C. for ten seconds to three minutes.

Because the metal silicide will react with oxygen in ambient atmosphere to form a native oxide layer on its surface under normal temperatures, an oxide layer is formed on the metal silicide after the thermal process. The oxide layer is removed by pre-metal etching step 34 and the metal sputtering process can be conducted thereafter.

Figure 4A:
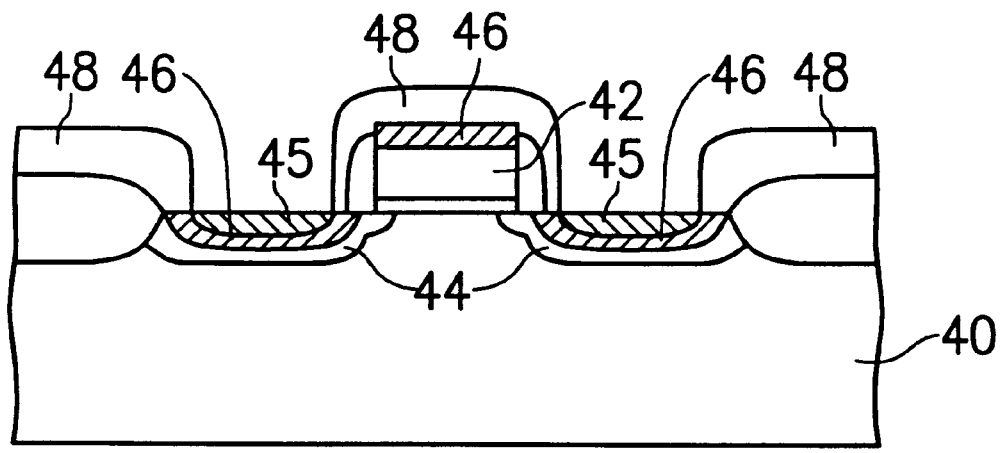
FIGS. 4A and 4B are schematic cross-sectional diagrams illustrating a preferred embodiment of the process before pre-metal etching and the process after pre-metal etching according to the present invention.
Figure 4B:
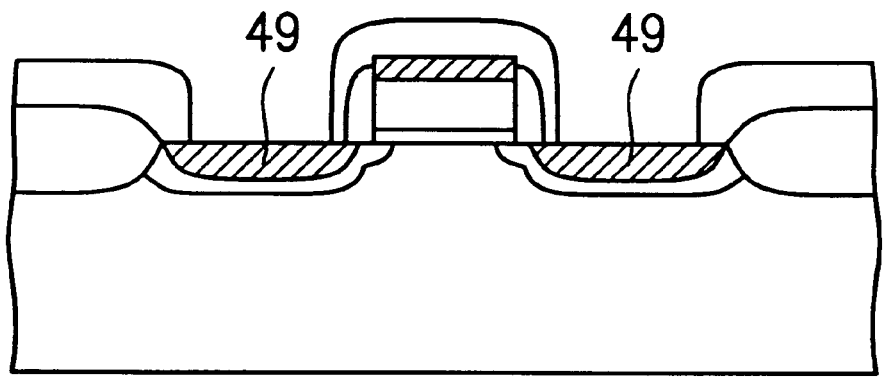

FIGS. 4A and 4B are schematic cross-sectional diagrams illustrating a preferred embodiment of the process before pre-metal etching and the process after pre-metal etching according to the present invention. Referring to FIG. 4A, before the pre-metal etching step, the main structure of the MOS transistor is completed, which includes a silicon substrate 40, and a polysilicon gate 42 and doped source/drain electrodes regions 44 formed on the silicon substrate. A metal silicide layer 46 made of TiSi$_2$ is formed on the polysilicon gate 42 and doped source/drain electrodes regions 44. A glass protecting layer 48 is deposited thereon. After dry etching, contact windows are defined, but the metal silicide layer will be damaged and thus forming a damaged metal silicide layer 45.

Titanium is a metal with good oxygen gettering ability. Under proper temperatures (about 500° C.), titanium will react with silicon to form TiSi$_2$. Since TiSi$_2$ has low resistance, a fine ohmic contact can be formed at the interface of the titanium and silicon. Aside from titanium, other metals that can form a low resistance ohmic contact can be used in the present invention to form the metal silicide layer.

Referring to FIG. 4B, according to the present invention, before pre-metal etching, the damaged metal silicide layer is repaired by a thermal process. Therefore the metal silicide layer will not be easily removed in pre-metal etching, and a thick metal silicide layer 49 will be maintained, so that the resistance of the metal silicide layer 49 will not be increased excessively. Table II below shows the change of resistance of the metal silicide of TiSi$_2$.

TABLE II

| original resistance | resistance after dry etching | resistance after thermal process | duration of pre-metal etching | resistance after pre-metal etching |
|---|---|---|---|---|
| 3.3 Ω | 4.76 Ω | 4.7 Ω | 20 sec | 4.72 Ω |
| 3.3 Ω | 4.76 Ω | 4.7 Ω | 40 sec | 5.25 Ω |
| 3.3 Ω | 4.76 Ω | 4.7 Ω | 60 sec | 9.95 Ω |

As stated above, since the resistance of the metal silicide will not be increased too much after pre-metal etching, the sheet resistance of the source/drain electrodes remains low and a very small amount of junction leakage can be maintained.

While the invention has been described by way of example and in terms of preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process of pre-metal etching loss of metal silicide, comprising the steps of:
   (a) providing a silicon substrate, wherein a polysilicon gate and doped source/drain electrode regions are formed on the silicon substrate, a metal silicide layer is formed on the polysilicon gate and the doped source/drain electrode regions, and a protecting glass layer is formed thereon;
   (b) dry etching the protecting glass layer to define a contact window, so that the metal silicide layer is damaged and exposed by the contact window;
   (c) performing thermal process to repair the damaged metal silicide layer; and
   (d) performing pre-metal etching.

2. A process according to claim 1, wherein the thermal process comprises heating in a furnace at a temperature from 550° C. to 850° C. for five to thirty minutes.

3. A process according to claim 1, wherein the thermal process comprises rapid thermal processing at a temperature from 550° C. to 850° C. for ten seconds to three minutes.

4. A process according to claim 1, wherein the protecting glass layer is borophosphosilicate glass.

5. A process according to claim 1, wherein the protecting glass layer is phosphosilicate glass.

6. A process according to claim 1, wherein the metal suicide layer is TiSi$_2$.

7. A process accordingly to claim 1, wherein step (d) is after step (c).

8. A process of pre-metal etching for reducing loss of metal silicide, comprising the steps of:
   (a) providing a silicon substrate;
   (b) forming a polysilicon gate and doped source/drain electrode regions on the silicon substrate;
   (c) forming a metal silicide layer on the polysilicon gate and the doped source/drain electrode regions;
   (d) forming a protecting glass layer on the metal silicide layer;
   (e) dry etching the protecting glass layer to define a contact window while forming a damaged metal silicide layer in the metal silicide layer;
   (f) performing a rapid thermal process to repair the damaged metal silicide layer; and
   (g) performing a pre-metal etching process;
   wherein step (f) is performed after steps (a)–(e).

9. A process of pre-metal etching for reducing loss of metal silicide, comprising the steps of:
   (a) providing a partially-formed integrated circuit device including a polysilicon gate and doped source/drain electrode regions formed on a silicon substrate, a metal silicide layer formed directly on the polysilicon gate and the doped source/drain electrode regions, and a protective glass layer formed thereon;
   (b) dry etching the protective glass layer to define a contact window, the dry etching damaging the metal silicide layer under the contact window;
   (c) after step (b), performing a thermal process to repair the damaged metal silicide layer;
   (d) after step (c), performing pre-metal etching to remove an oxide layer on the surface of the repaired metal silicide layer; and (e) after step (d), depositing a metal layer on the etched metal silicide layer.

10. A process according to claim 9, wherein the metal silicide layer is $TiSi_2$.

11. A process according to claim 9, wherein the oxide layer on the surface of the repaired metal silicide layer is a native oxide layer.

12. A process according to claim 9, wherein the resistance of the metal silicide layer after step (c) is about 4.7 ohms and the resistance after conducting the pre-metal etching for about forty seconds is about 5.3 ohms.

13. A process according to claim 9, wherein resistance of the metal silicide layer after step (c) is about 5 ohms and the resistance after conducting the pre-metal etching for about sixty seconds is about 10 ohms.

14. A process according to claim 9, wherein step (c) comprises heating in a furnace at a temperature from 550° C. to 850° C. for five to thirty minutes.

15. A process according to claim 9, wherein the protective glass layer is borophosphosilicate glass.

16. A process according to claim 9, wherein the protective glass layer is phophosilicate glass.

17. A process according to claim 9, wherein step (e) includes metal sputtering on the etched metal silicide layer.

\* \* \* \* \*